United States Patent
Blumrich

(10) Patent No.: US 10,535,132 B2
(45) Date of Patent: Jan. 14, 2020

(54) METHOD FOR DETERMINING A DISTANCE BETWEEN A FIRST STRUCTURE ELEMENT ON A SUBSTRATE AND A SECOND STRUCTURE ELEMENT

(71) Applicant: Carl Zeiss SMT GmbH, Oberkochen (DE)

(72) Inventor: Joerg Frederik Blumrich, Jena (DE)

(73) Assignee: Carl Zeiss SMT SmbH, Oberkochen (DE)

(*) Notice: Subject to any disclaimer, the term of this patent is extended or adjusted under 35 U.S.C. 154(b) by 138 days.

(21) Appl. No.: 15/713,042

(22) Filed: Sep. 22, 2017

(65) Prior Publication Data

US 2018/0089817 A1    Mar. 29, 2018

(30) Foreign Application Priority Data

Sep. 26, 2016  (DE) .................. 10 2016 218 452

(51) Int. Cl.
  *G06T 7/00*  (2017.01)
  *G03F 1/84*  (2012.01)
  (Continued)

(52) U.S. Cl.
  CPC .............. *G06T 7/001* (2013.01); *G02B 21/14* (2013.01); *G02B 21/365* (2013.01);
  (Continued)

(58) Field of Classification Search
  CPC ........... G06T 7/001; G06T 2207/10148; G06T 2207/10152; G06T 2207/30148;
  (Continued)

(56) References Cited

U.S. PATENT DOCUMENTS 6,476,388 B1 *  11/2002  Nakagaki ............. G01N 23/225
                                                                   250/306
8,369,605 B2    2/2013   Arnz et al.
(Continued)

FOREIGN PATENT DOCUMENTS

DE   10 2006 059 431   6/2008   ............... G03F 7/20
DE   10 2010 047 051   3/2012   ............... G06T 7/60
(Continued)

OTHER PUBLICATIONS

German Office Action for German Application No. 10 2016 218 452.0 dated May 15, 2017.
(Continued)

*Primary Examiner* — Wesley J Tucker
(74) *Attorney, Agent, or Firm* — Fish & Richardson P.C.

(57) ABSTRACT

Provision is made of a method for determining a distance between a first structure element on a substrate and a second structure element, comprising the following steps: providing a first series of first images, wherein each of the first images comprises at least the first structure element, providing a second series of second images, wherein each of the second images comprises at least the second structure element. The method includes, for each image of the first and second series: determining a respective correlation function from a respective first image of the first series and a respective second image of the second series. The method includes determining an ensemble correlation function from the correlation functions, and determining the distance from the ensemble correlation function.
Furthermore, a microscope for carrying out the method is provided.

21 Claims, 3 Drawing Sheets

(51) Int. Cl.
*G02B 21/36* (2006.01)
*G02B 21/14* (2006.01)
*G06T 7/55* (2017.01)
*G06T 7/13* (2017.01)

(52) U.S. Cl.
CPC ............ *G02B 21/367* (2013.01); *G03F 1/84* (2013.01); *G06T 7/13* (2017.01); *G06T 7/55* (2017.01); *G06T 2207/10016* (2013.01); *G06T 2207/10056* (2013.01); *G06T 2207/10148* (2013.01); *G06T 2207/10152* (2013.01); *G06T 2207/30148* (2013.01)

(58) Field of Classification Search
CPC ... G06T 2207/10056; G06T 7/55; G06T 7/13; G06T 2207/10016; G06K 9/6203; G03F 1/84; G02B 21/365
USPC ......................................................... 382/144
See application file for complete search history.

(56) References Cited

U.S. PATENT DOCUMENTS

| | | | |
|---|---|---|---|
| 8,717,581 | B2 | 5/2014 | Laengle |
| 2012/0081712 | A1* | 4/2012 | Laengle .................... G03F 1/84 356/620 |
| 2012/0134542 | A1* | 5/2012 | Pang ....................... G06T 7/001 382/106 |
| 2014/0297223 | A1* | 10/2014 | Hibbs .................... G01B 11/24 702/167 |
| 2016/0104275 | A1* | 4/2016 | Arnz ....................... G06T 7/001 382/151 |
| 2017/0091921 | A1 | 3/2017 | Seidel |
| 2017/0115557 | A1 | 4/2017 | Peters et al. |

FOREIGN PATENT DOCUMENTS

| | | | | |
|---|---|---|---|---|
| DE | 10 2014 213 198 | | 1/2016 | ............... G03F 1/84 |
| DE | 10 2015 218 917 | | 3/2017 | ............... G03F 9/00 |
| WO | WO 2008/025433 | | 3/2008 | ............... G01J 9/00 |

OTHER PUBLICATIONS

R. Attota et al., "Through-focus Scanning and Scatterfield Optical Methods for Advanced Overlay Target Analysis", *Proc. of SPIE*, vol. 7272, pp. 727214-1-727214-13 (2009).

F. Blumrich: Optische korrelationsbasierte Messtechnik mittels zufälliger Punktemuster Dissertation. Institut für Photogrammetrie der Universität Stuttgart. 2009.

H.H. Hopkins, "On the diffraction theory of optical images", Proceedings of the Royal Society of London. Series A, Mathematical and Physical Sciences, vol. 217, Issue 1130, pp. 408-432, (May 7, 1953).

M. Totzeck, "Numerical simulation of high-NA quantitative polarization microscopy and corresponding near-fields," Optik, vol. 112, No. 9, pp. 399-406 (2001).

* cited by examiner

METHOD FOR DETERMINING A DISTANCE BETWEEN A FIRST STRUCTURE ELEMENT ON A SUBSTRATE AND A SECOND STRUCTURE ELEMENT

CROSS-REFERENCE TO RELATED APPLICATION

Under 35 U.S.C. § 119, this application claims priority to German Patent Application 10 2016 218 452.0, filed on Sep. 26, 2016. The disclosure content of the above application is hereby incorporated by reference in its entirety.

TECHNICAL FIELD

The invention relates to a method for determining a distance between a first structure element on a substrate and a second structure element.

The invention additionally relates to a microscope for carrying out the method.

BACKGROUND

In order to produce semiconductor components, in lithography by use of scanners or steppers the structures of masks, also referred to as reticles, are transferred to wafers. In order to ensure that the masks used are free of defects, they are subjected to extensive examinations before use in wafer exposure. The methods disclosed in this patent specification are also generally applicable to substrates which comprise structure elements.

One method for examining masks is the highly accurate measurement of the positions of structures on masks. This is referred to as "registration" or "photomask pattern placement." Using a microscope, referred to as a position measuring device (registration tool), specific check structures—referred to as "registration pattern"—on the masks, such as, for example, squares, crosses or angles, are measured and compared with their setpoint positions. Positions of structures on the mask which are part of the used structures of the mask are also measured. This is referred to as "Real Pattern Registration."

In order to examine a mask, the dimensions of structure features, such as the width of lines or the diameter of contact holes, are also measured. In one variant, the smallest structure features that can still be represented are measured. These are also referred to as critical dimensions, CD for short. Specific microscopes such as, for example, the WLCD from Zeiss are used for carrying out these measurements.

In the examinations mentioned, a corresponding microscope is used to image an aerial image of the structure of a mask onto a light-sensitive spatially resolving detector, such as a charge coupled device (CCD) chip, for example. Under the control of a computer, the aerial images imaged onto the detector are recorded and stored as files.

Besides aerial images, phase images of the masks can also be determined. It has been recognized, as described in DE10201.5218917 and US patent application publication 2017091921, that phase images have a higher edge steepness than intensity images. The entire contents of DE102015218917 and US2017091921 are incorporated by reference. The accuracy and reproducibility of the localization of structure features can thus be increased by the analysis of a phase image.

In order to evaluate the aerial images and the phase images, often the objective is to determine the distance of a structure feature in two images to be compared.

By way of example, in order to determine the position of a structure feature of a measured aerial image, the position thereof can be correlated with the structure feature of a simulated aerial image. The simulation of the aerial image is effected from the mask design underlying the mask to be examined.

In a further example, the aerial image or the phase image of a registration pattern is recorded by a position measuring device. A further aerial image is determined by mirroring of the aerial image. The mirroring is effected for example on two mirror planes, which are embodied parallel to the X axis and to the Y axis and which intersect at the midpoint of the aerial image. The distance between the two aerial images can be determined by the correlation of said aerial images. From said distance it is possible to determine the distance between the measured registration pattern and the setpoint position thereof. This method is explained in detail in the published patent application DE102010047051 and U.S. Pat. No. 8,717,581. The entire contents of DE102010047051 and U.S. Pat. No. 8,717,581 are incorporated by reference.

SUMMARY

In order to increase the measurement accuracy, a plurality of images of a structure element can be recorded and their average value can be formed. It is disadvantageous here that the improvement of the signal to noise ratio (reduction of the image noise) in the image obtained is only small.

In order to increase the measurement accuracy, aerial images can be recorded with different recording conditions. During the recording of aerial images, by way of example, the illumination settings (i.e. the angular distribution of the illumination) or the wavelength of the illumination radiation can be varied. The focus can also be varied. In other words, so-called focus stacks can be recorded. As mentioned above, phase images can also be determined besides aerial images. In the evaluation of a series of aerial images, what is disadvantageous is that averaging from aerial images and phase images is meaningful only to a limited extent since the aerial images are not directly comparable.

Therefore, a feature of the invention is to provide a method which enables the highly accurate determination of the distance between structure elements whilst avoiding or minimizing the disadvantages mentioned.

This feature is achieved according to the invention by use of a method for determining a distance between a first structure element on a substrate and a second structure element, comprising the following steps:

providing a first series of first images, wherein each of the first images comprises at least the first structure element, providing a second series of second images, wherein each of the second images comprises at least the second structure element, for each image of the first and second series: determining a respective correlation function from a respective first image of the first series and a respective second image of the second series, determining an ensemble correlation function from the correlation functions, and determining the distance from the ensemble correlation function.

The substrate can be embodied for example as a mask. The correlation function can be, e.g., a cross correlation.

The first structure element and the second structure element, relative to the mask design, can be the same structure element which is comprised in each case by the first series of images and the second series of images.

The first and second structure elements, relative to the mask design, can be different structure elements, such that the first series of images and the second series of images comprise different structure elements.

When determining an ensemble correlation function, firstly correlation functions are formed from first and second images in pairs and the average value is formed from said correlation functions.

Each individual correlation function is composed of the actual measurement signal (corresponds to the true signal sought) convolved with the point spread function (PSF) of the imaging system of a microscope used and a portion of statistical disturbances (noise). The expected value of the statistical disturbances in the correlation function is zero since here the range of values is symmetrical with respect to zero. The range of values of a normalized correlation function is typically in a range of −1 to +1. If the sum is formed over all cross correlation functions, then the portions of the actual measurement signal sought are added up since, in the case of stationary objects, they occur respectively at (almost) the same position of the cross correlation function. The statistical portions simultaneously average out over the correlation functions. Thus, the summation of the correlation functions results in an increase in the signal to noise ratio in the ensemble correlation function.

It is therefore advantageous to carry out the determination of the distance with an ensemble correlation function since a higher reliability and accuracy are achieved as a result.

In a further configuration of the invention, an aerial image or a phase image is provided as at least one of the images.

Firstly only a spatially resolved distribution of the intensity of the illumination radiation after interaction with the object is measured by the images measured in the image plane of a microscope. Said intensity is the absolute value of the square of the amplitude of the illumination radiation after interaction with the object. These images are referred to as aerial images, intensity images or amplitude images.

It has been recognized, as described in DE10201.5218917, that phase images have a higher edge steepness than intensity images. By analyzing a phase image, it is thus possible to increase the accuracy and reproducibility of the localization of the structure features.

In a further configuration of the invention, the image is determined by a microscope.

Besides conventional microscopes, mask inspection microscopes can be used, for example, for the examination of masks. Said mask inspection microscopes have objectives which, on the object side, i.e. on the mask side, have a numerical aperture (NA) corresponding to that of scanners which are used during wafer exposure.

Position measuring devices used for the highly accurate measurement of masks can also be used as microscopes.

In a further variant of the invention, at least two aerial images are recorded by a conventional microscope for the purpose of determining a phase image, wherein the at least two aerial images are recorded under diversified conditions.

The phase image is determined from the at least two suitable aerial images of the measured region of the substrate. In this case, the conditions of the recordings differ in a defined manner.

In one variant of this measure, the diversifications can be described by mathematical models. It is thus possible to use known algorithms for determining the phase image.

In a further variant of this measure, the diversification is effected by the recording of the at least two aerial images which are arranged in parallel planes spaced apart from one another in the Z direction. Numerous methods are available for determining phase images from a set of aerial images of spaced apart parallel planes, which is also referred to as image stack, focus stack or Z stack. Examples include the IFTA algorithm or the TIE algorithm.

This measure has the advantage that the phase images can be determined rapidly even with the use of simple microscopes.

A phase contrast microscope can also be used for determining a phase image. Accordingly, the term phase images also denotes images which contain a mixture of phase information and amplitude information. The direct measurement of such phase images can be effected for example by a Zernike phase contrast microscope or a differential interference contrast microscope.

In a further configuration of the invention, the image is determined by simulation.

In the examination of masks, the mask design is often known. An aerial image can then be simulated from the mask design, which aerial image is compared with an aerial image recorded by a microscope. In this way, it is possible to implement distances between the measured positions, i.e. actual positions, of structure features and the setpoint positions of structure features as determined by simulation.

In a further configuration of the invention, the images of the second series are determined from the images of the first series by a geometric transformation. Said transformation can comprise at least one of the following transformations: displacement (translation), turning (rotation), extension (centric extension), or similarity mapping.

In a further configuration of the invention, the images of the second series are determined by mirroring from the images of the first series.

The mirroring is effected for example on two mirror planes, which are embodied parallel to the X axis and to the Y axis and which intersect at the midpoint of the aerial image.

This measure can be used in the determination of the position of symmetrical registration patterns. By use of the distance between image and mirror image of a registration pattern, the distance between said registration pattern and the setpoint position can be determined in a rapid and simple manner. Details concerning this method are disclosed in the published patent application DEI02010047051.

In a further configuration of the invention, the recording conditions are varied within a series of aerial images, wherein the recording conditions of the first and second aerial images of the first and second series are identical in pairs.

Recording conditions are for example:
The illumination setting, i.e. the angular distribution or intensity distribution of the illumination radiation. This also encompasses the illumination directions or the aperture angle, which is also referred to as sigma. The variation of the detection direction during the recording of an aerial image is also encompassed here.
The polarization of the illumination radiation in the illumination beam path or in the imaging beam path.
The wavelength or the wavelength range of the illumination radiation used.
Exposure times.
The focus settings. So-called focus stacks are recorded.
The type of image, i.e. whether aerial images or phase images are determined.

This measure has the advantage that an averaging over data which otherwise would not be possible becomes possible by use of the correlation functions.

In a further configuration of the invention, the varied recording conditions are illumination settings or focus settings.

In one variant of this measure, a series comprises a focus stack.

In a further configuration of the invention, at least one region of the structure element which is taken into account in the determination of the distance is predefined in the images.

This measure has the advantage that disturbing features can be removed during the evaluation of the images.

In a further configuration of the invention, the structure element or the at least one region of the structure element is embodied as an edge of the structure element.

This measure is often used during the measurement of structures on masks.

In a further configuration of the invention, the ensemble correlation is applied via the focus stacks in Through-focus Scanning Optical Microscopy (TSOM) and/or Scatterfield Optical Microscopy (SOM).

The invention also encompasses a microscope for carrying out the method. Said microscope comprises: a light source, an illumination optical unit, a detector for recording an image, an imaging optical unit for generating the image of at least one structure element of a substrate on the detector, a computer, which is programmed in such a way that, for carrying out the methods mentioned, the microscope used is controlled by said computer and that calculations appertaining to the method are carried out.

Unless otherwise defined, all technical and scientific terms used herein have the same meaning as commonly understood by one of ordinary skill in the art to which this invention belongs. In case of conflict with patents or patent application publications incorporated herein by reference, the present specification, including definitions, will control:

It goes without saying that the features of the invention mentioned above and those yet to be explained below can be used not only in the combinations described, but also in other combinations or individually, without departing from the scope of the present invention.

BRIEF DESCRIPTION OF DRAWINGS

The invention is described and explained in greater detail below on the basis of some selected exemplary embodiments and with reference to the drawings.

In the figures.

DETAILED DESCRIPTION

The first or second images comprising a first or second structure element can be determined by recording by a microscope or by simulation proceeding from stipulations of the object.

The first or second images can be aerial images, or amplitude images, or phase images.

Figure 1:
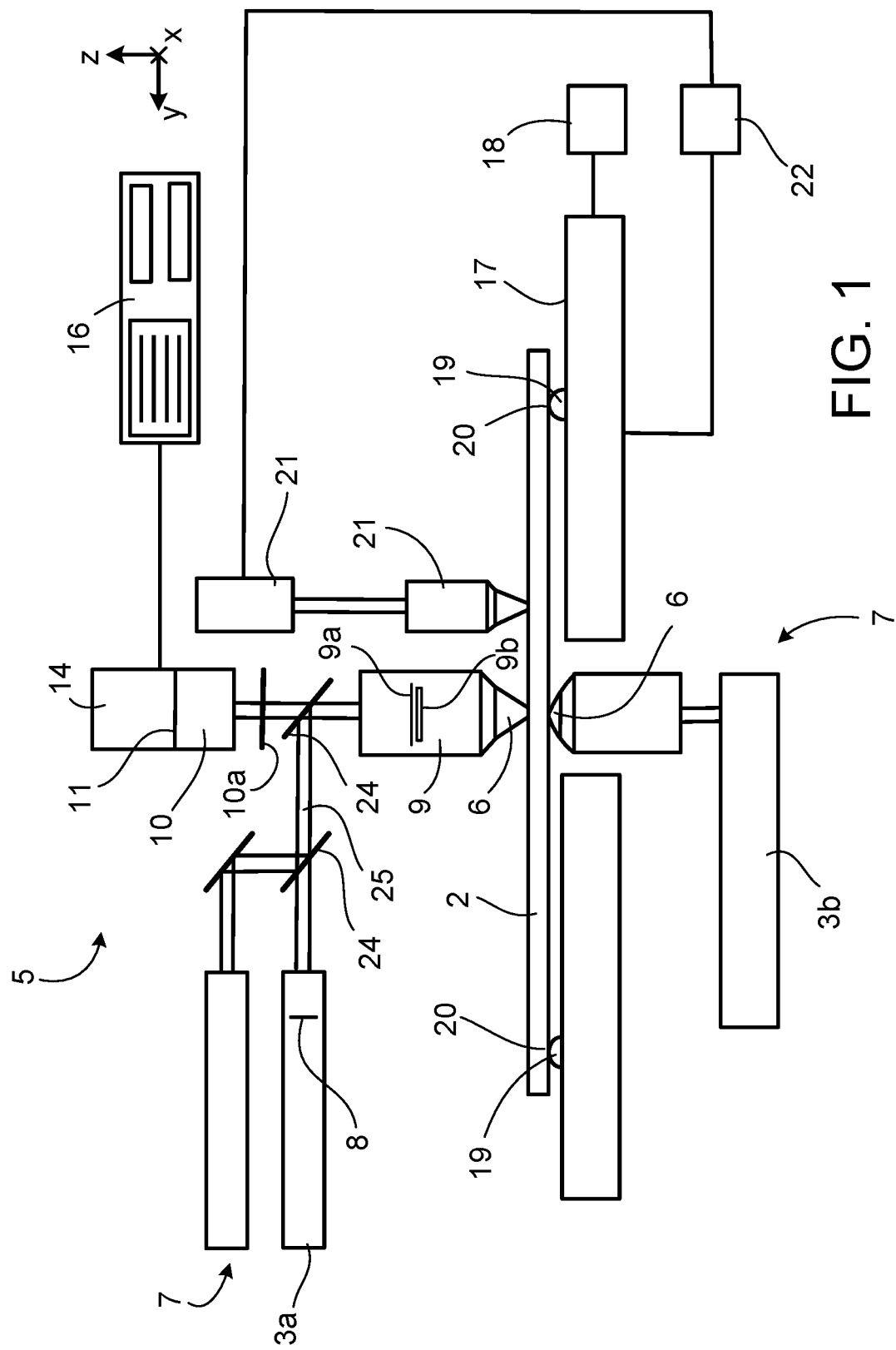
FIG. 1: shows a schematic diagram of the microscope for measuring the position of structures on substrates.

FIG. 1 shows a microscope 5 serving for measuring aerial images of substrates, such as masks, for example. The construction of such a microscope 5 is explained below.

The microscope 5 comprises an illumination device 3. Two illumination devices 3a and 3b (collectively referenced as 3) are illustrated in FIG. 1, wherein the upper illumination device 3a serves for illuminating the substrate 2 for measurements of the reflection. The lower illumination device 3b serves for illuminating the substrate 2 in transmission. The microscope 5 comprises at least one of these two illumination devices 3a and 3b. It can also comprise both illumination devices 3a and 3b. Two different illumination devices 3a and 3b make it possible, for example, to use the microscope 5 for measurement on different substrates 2.

Figure 2:
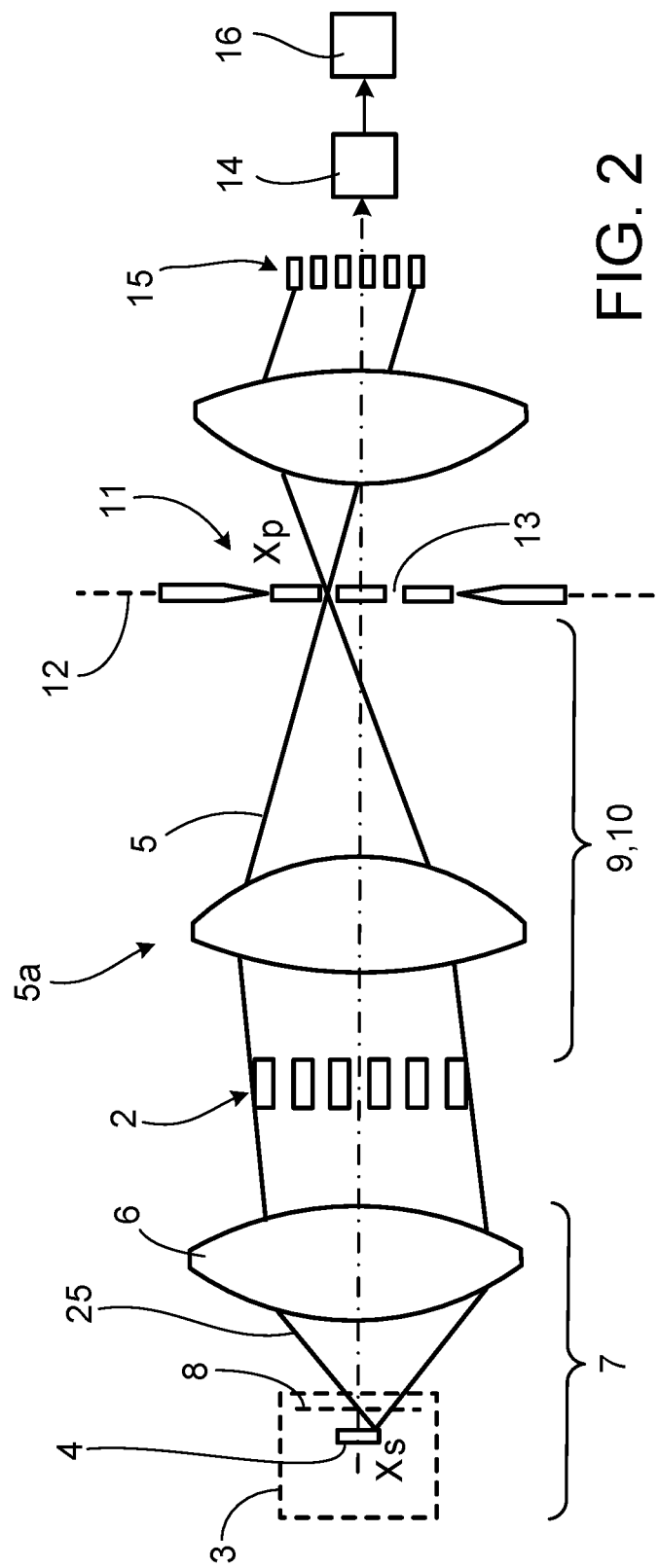
FIG. 2: shows a schematic diagram of the changes of the microscope from FIG. 1, which is embodied here as a phase contrast microscope.

The illumination device 3 comprises a radiation source 4 (e.g., see FIG. 2). The radiation source 4 can be for example a laser, for example an ArF laser. The radiation source 4 serves for generating illumination radiation 25. The illumination radiation 25 has a wavelength of, e.g., 193 nm. In one variant of the microscope 5, the illumination radiation 25 has a wavelength of, e.g., 13.5 nm.

Alternative radiation sources 4 which generate illumination radiation 25 having other wavelengths or in a different wavelength range are likewise possible.

The illumination devices 3a and 3b may be part of an illumination system 7 comprising further optical components.

The illumination system 7 can comprise a stop 8. The stop 8 defines an illumination setting for illuminating the substrate 2. The stop 8 is embodied for example in a ring-shaped fashion, that is to say in an annular fashion. The stop 8 is arranged in the region of the entrance pupil of the illumination system 7. The substrate 2 is then illuminated with a ring-shaped, that is to say annular, illumination setting.

Besides ring-shaped illumination settings, further illumination settings that are customary in lithography, such as e.g. dipolar or quadrupolar illumination settings, are also used. Further illumination settings to be predefined as desired can also be used. Monopolar illumination settings which to a good approximation correspond to a coherent radiation of a predefined angle are also used.

Instead of a stop 8, it is also possible to realize an illumination setting by use of a correspondingly switched micromirror array.

The microscope 5 comprises an imaging optical unit 9. The imaging optical unit 9 has an object-side numerical aperture of, e.g., 0.8. The imaging optical unit 9 is also referred to as a projection optical unit.

A magnifying optical unit 10 is arranged downstream of the imaging optical unit 9 in the beam path. The total magnification of the imaging optical unit 9 and of the magnifying optical unit 10 is, e.g., 265:1.

For some of the measuring methods used, an optical element 9b is used in the pupil plane 9a of the imaging optical unit 9. For example, said optical element can be embodied as a spatial frequency filter. The spatial frequency filter can be embodied as a pupil stop.

The microscope 5 furthermore comprises a sensor device. For example, the sensor device is embodied as a camera, for example as a CCD camera 14. An image 15 (e.g., see FIG. 2) of the substrate 2 to be examined is recorded by use of the CCD camera 14. The CCD camera 14 is connected in a data-transferring manner to an image processing device embodied as a computer 16.

For some of the measuring methods used, a Bertrand lens element is inserted into the optical beam path between the imaging optical unit 9 and the sensor device 14. Said lens element makes it possible to image the pupil plane 9a of the imaging optical unit 9 on the sensor device 14.

Furthermore, the microscope 5 comprises a holding device 17, also referred to as a stage. The holding device 17 comprises three supports 19. The supports 19 form bearing points 20 at which the substrate 2 bears on the holding device 17. The substrate 2 lies on the holding device 17 for example in such a way that the side to be structured faces upwards. The substrate 2 bears on the supports 19 for example by the side opposite to the side to be structured.

The holding device 17 serves for positioning the substrate 2 in the beam path of the microscope 1. The holding device 17 is actively controllable. It is controlled by the image processing device 16. It is precisely displaceable, for example. It has, e.g., six degrees of freedom of displacement. For example, an interferometer device 18 is provided for determining the position and/or alignment of the holding device 17.

For choosing the region to be measured of the substrate 2, the substrate is moved into a position by the movement of the holding device 17 perpendicular to the optical axis of the imaging optical unit 9 (also referred to as X-Y-plane), such that the region to be measured is situated in the image field of the imaging optical unit 9. For focusing, the holding device is moved in the direction of the optical axis of the imaging optical unit 9 (also referred to as the Z-axis), such that the region to be measured becomes located in the best focal plane. Furthermore, the microscope 5 comprises an autofocus system, in which one or a plurality of beam splitters 24 are provided.

Furthermore, the microscope 5 comprises an auxiliary optical unit 21. The auxiliary optical unit 21 is connected, in a data-transferring manner, to a control device 22 for controlling the displacement of the holding device 17. The substrate 2 can be coarsely aligned by use of the auxiliary optical unit 21.

The image processing device 16 is embodied as a computer that is programmed to control the microscopes mentioned. The image processing device 16 is additionally programmed to carry out the evaluation methods mentioned below.

In one variant of the invention, the microscope 5 is embodied as a Zernike phase contrast microscope 5a. The latter is explained with reference to FIG. 2.

An annular illumination is used which is shaped by a correspondingly shaped stop 8 in the pupil of the illumination device 3. The annular illumination which can be generated with the aid of the radiation source 4 and/or the stop 8 has an inner radius $r_{i0}$. The illumination pupil for illuminating the substrate 2 has an outer radius $R_{ip}$.

The imaging optical unit 9 and the magnifying optical unit 10 are parts of a phase contrast optical unit. The lens element 6 illustrated in FIG. 2 should be understood to be by way of example. This component can also involve a plurality of lens elements and/or one or a plurality of mirrors.

Moreover, the phase contrast optical unit (including the imaging optical unit 9 and the magnifying optical unit 10) comprises a phase mask 11. The phase mask 11 is arranged in a pupil plane 12 (e.g., see FIG. 2) of the beam path of the illumination radiation 25. It is arranged in the beam path downstream of the magnifying optical unit 10.

The phase mask 11 is, e.g., a $\pi/2$ phase mask. The illumination radiation 25 thus experiences a phase shift by $\pi/2$ upon passing through the phase mask 11.

The phase mask 11 is adapted to the shape of the illumination setting, for example to the shape of the stop 8. It is embodied for example in such a way that the stop 8 is imaged precisely onto the phase-shifting region 13 (e.g., see FIG. 2) of the phase mask 11. The illumination radiation 25 propagating directly from the radiation source 4 to the phase mask 11, that is to say the illumination radiation 25 which reaches the phase mask 11 in a manner free of diffraction, is thus shifted by $\pi/2$ phases by the phase mask 11. The diffracted illumination radiation 25 is not incident on the phase-shifting region of the phase mask 11 and remains unchanged. An interference of the diffracted and undiffracted portions of the illumination radiation 25 thus occurs. This in turn makes it possible to determine the phase distribution of the wavefront by use of a detector, for example by use of the CCD camera 14.

The phase mask 11 is embodied, e.g., in a circular fashion or in the shape of a circular ring, e.g., in an annular fashion. This is advantageous for a high contrast-to-noise ratio.

For structure elements of a mask, provision is made of a ring-shaped (i.e., annular) illumination having an inner radius $r_{i0}$ whose ratio to the radius $R_{ip}$ of the illumination pupil is, e.g., in the range of 0.4 to 0.5 or in the range of 0.5 to 0.6 or in the range of 0.6 to 0.7. The outer radius of the illumination is determined by the degree of filling of the illumination pupil. Correspondingly, the phase mask 11 has in the image-side aperture an inner radius $r_{a,0}$ whose ratio to the radius $R_{ap}$ of the image-side aperture is within the ratios mentioned.

If an illumination pupil having a lower degree of filling is used, an illumination of the substrate 2 to be examined with an inner radius $r_{i0}=0$ is suitable. Here, too, the outer radius is predefined by the degree of filling of the illumination pupil. In this case, the phase mask 11 also has an inner radius $r_{a,0}=0$.

In one variant of the invention, the microscope 5 is embodied as a differential interference contrast microscope. The differential interference contrast method is also referred to as the differential interference contrast or Nomarski contrast method. In this method, as in the case of a Zernike phase contrast microscope 5a, a phase image is generated directly.

In order to record a first aerial image of a first structure element on a substrate, the substrate, for example a mask 2, is placed onto the stage 17. As a result of the stage 17 being moved, that segment of the mask which comprises the first structure element is brought into the beam path of the microscope. A first aerial image is then recorded by the detector 14 under the control of the computer 16.

A phase image can be reconstructed from a plurality of aerial images (amplitude images). At least two aerial images are recorded by the microscope 5 under diversified conditions.

A diversification can be effected for example by use of at least one of the following measures:
  by the recording of at least two aerial images in parallel planes spaced apart from one another, i.e. the recording of a focus stack;
  by a spatial frequency filtering in the pupil plane of the imaging beam path of the imaging;
  by the recording of the at least two aerial images with different illumination directions.

In some implementations, in order to determine a phase image, individual aerial images can be recorded with coherent illumination. It is also possible to record the individual aerial images with non-coherent illumination and to determine a phase image on the basis of said aerial images. The determined phase is then referred to as equivalence phase. The equivalence phase can be used as a basis for a registration measurement in the same way as the image phase.

Various methods can be provided for the reconstruction step. For example, a method selected from the following list can be provided: phase determination by use of an Iterative Fourier Transformation Algorithm (IFTA), for example by use of a Gerchberg-Saxton algorithm, model-based phase determination, methods based on the Transport of Intensity Equation (TIE), and Fourier ptychography. Further methods for determining the image phase or the equivalence phase in the reconstruction step are likewise possible. For details of the phase determination by use of an Iterative Fourier Transformation Algorithm, reference should be made to the published patent application WO 2008/025433 A2. The entire disclosure content of WO 2008/025433 A2 is incorporated by reference.

The model-based phase determination can also be used for determining a phase image. In the model-based phase determination, the phase is not determined pixel by pixel, rather the parameters of a model, for example Zernike polynomials, are determined for example iteratively, too. A modal decomposition of the unknown phase function is taken as a basis. By applying the extended Nijboer-Zernike theory (ENZ), for example, it is possible to represent the phase function by a small number of complex Zernike polynomials.

The term phase image also denotes images hick contain a mixture of phase information and amplitude information. The direct measurement of such phase images can be effected for example by the Zernike phase contrast microscope described or by a differential interference contrast microscope. Further details concerning the suitable phase contrast microscope and the methods mentioned are described in the German patent application DE102015218917.

The simulation of an image (aerial image or phase image) is effected by commercially available software such as, for example, MicroSim on the basis of the structure stipulations of the mask, the mask design. The IN/licroSim software is described for example in: M. Totzeck, "Numerical simulation of high-NA quantitative polarization microscopy and corresponding near-fields," Optik, 112 (2001) 381-390, MicroSim-Software, University of Stuttgart. The conditions of the imaging of the position measuring device such as, for example, the numerical aperture, wavelength and degree of coherence of the illumination, etc., are taken into account in the simulation. Effects which lead to a distortion of the aerial image during the imaging of the mask by the position measuring device, for example proximity effects, are taken into account. With regard to proximity effects and with regard to the simulation of aerial images, reference is made to the publication: H. H. Hopkins: On the diffraction theory of optical images. Proceedings of the Royal Society of London. Series A, Mathematical and Physical Sciences, 217 (1130): 408-432, 1953.

During the recording or the simulation of aerial images or phase images of a series, the following imaging parameters can be changed, for example:

- The illumination setting. This also encompasses the illumination directions or the aperture angle, also referred to as sigma. The variation of the detection direction during the recording of an aerial image is also encompassed here.
- The polarization of the illumination radiation in the illumination beam path or in the imaging beam path.
- Wavelength or wavelength range of the illumination radiation used.
- Exposure times.
- The focus settings. So-called focus stacks are recorded.

An example for carrying out the method of ensemble correlation is described below. A plurality of first images are recorded, which form a first series. In a first variant, the images of a series are recorded with the same recording conditions. The first series can comprise exclusively aerial images or exclusively phase images. The first series can also comprise phase images and aerial images.

In a second variant of the method, the images of a series are recorded with different imaging parameters.

In a third variant, the phase images are determined by different methods.

The individual parameters or method steps can be changed individually or in combinations.

In order to determine a second series of second images, in a first variant, the second images are determined from a predefined mask design by simulation. In this case, in accordance with the first series, aerial images or phase images are determined. The recording conditions of the first series are taken into account in the respective simulations. The aim in this variant is the pairwise correlation of first images of the first series with second images of the second series, wherein identical recording conditions are taken as a basis for the pairs to be correlated.

In order to determine a second series of second images, in a second variant, images of the first recording are mirrored. The mirroring is effected for example on two mirror axes, which are embodied parallel to the X axis and to the Y axis, respectively, and which intersect at the midpoint of the aerial image.

In order to determine a second series of second images, in a third variant, recordings of a second structure element are recorded by a microscope. Said structure element can be a structure element embodied on the same mask, such as an edge, for example. If the first structure element and the second structure element are not identically aligned, they can be correspondingly rotated before the correlation is carried out.

The order of the method steps when determining the images can be varied as desired.

In order to carry out the ensemble correlation, the following steps are carried out. A first series of first images shall be described as a matrix $A_h(r,c)$. A second series of second aerial images shall be described as a matrix $B_h(r,c)$. The index h describes the number of the aerial image of a series. The coordinates of the aerial image are described by the variables r and c. A line of an aerial image has n pixels. An aerial image has m lines. In the case of recorded images, this corresponds to the pixels of the detector of the microscope used. In the case of simulated aerial images, this corresponds to the size of the simulated aerial image. The number of images of a series is given by the parameter z.

The following holds true: $r \in [0, n]$, $c \in [0, m]$, $h \in [0, z]$

The correlation of a first image of the first series and a second image of the second series is calculated by equation 1:

$$R_h^{AB}(i,j) = \text{corr}[A_h(r,c), B_h(r,c)] \quad \text{Equation 1}$$

The parameters i and j are the coordinates of the correlation function.

The ensemble correlation is calculated by equation 2:

$$R_{Ensemble}(i, j) = \frac{1}{z}\sum_{h=0}^{z} R_h^{AB}(i, j) \quad \text{Equation 2}$$

For the position determination on the basis of the ensemble correlation function, firstly a maximum of this function is determined. The coordinates $i_{max}$ and $j_{max}$ corresponding to the maximum of the function $R_{Ensemble}$ are determined, in which $i_{max}$ and $j_{max}$ provide information about the distance directly in pixel coordinates. Information about the measuring device, e.g., the CCD pixel dimensions, can be used to determine the distance in terms of nanometers. For example, if $d_x$ is the distance of between neighboring pixels in the x direction, $d_y$ is the distance between neighboring pixels in the y direction, and assuming that all pixels have the same size, the distance D between the first and second structure features can be determined as follows:

$$D = \sqrt[2]{(i_{max}*d_x)^2 + (j_{max}*d_y)^2} \qquad \text{Equation 3}$$

The accuracy of this determination is initially limited to the resolution of the underlying aerial images.

A possible evaluation of the correlation function with subpixel accuracy is described in the published patent application DE102006059431A1 and U.S. Pat. No. 8,369,605. The entire contents of DE102006059431A1 and U.S. Pat. No. 8,369,605 are incorporated by reference.

The result of the ensemble correlation described above is the averaged distance between the first structure feature of the first images of the first series and the second structure feature of the second images of the second series.

Figure 3:
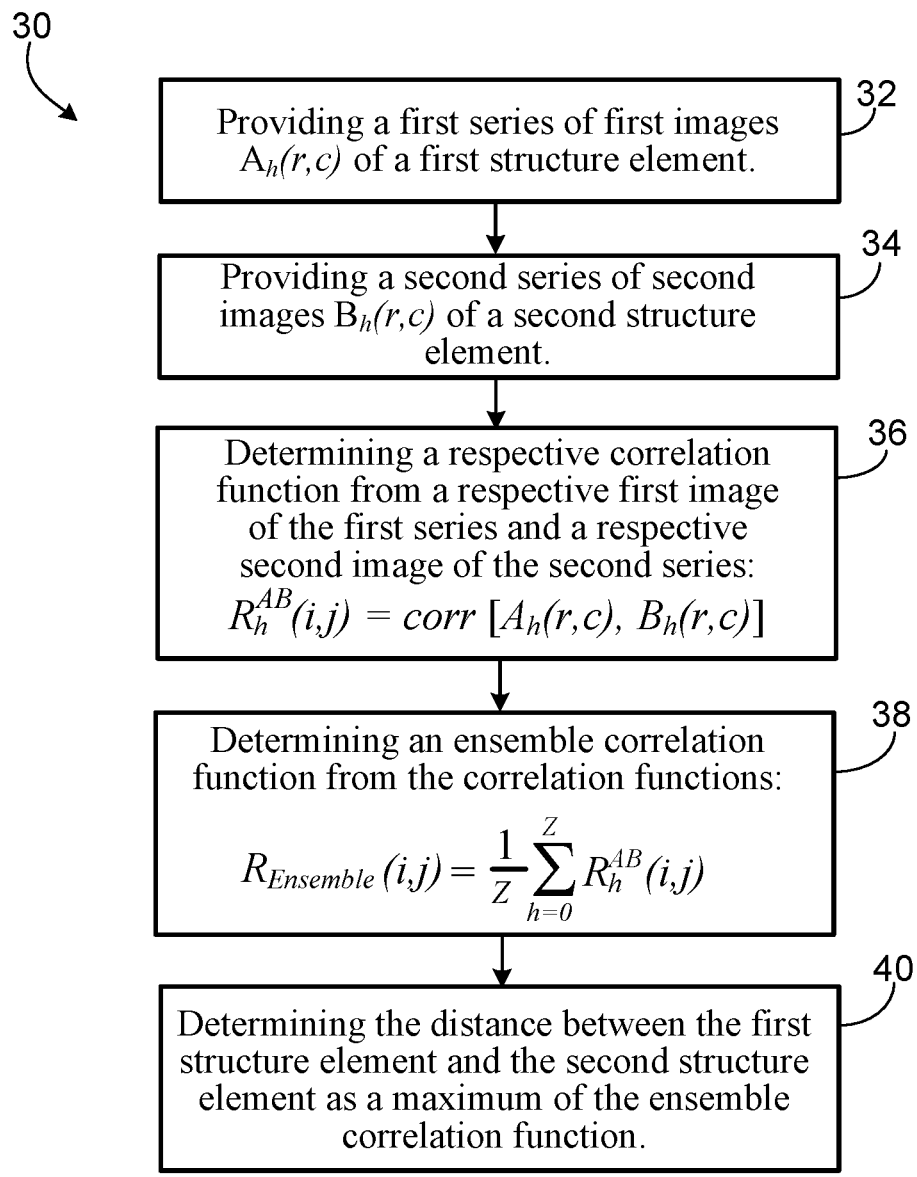
FIG. 3: shows a diagram for illustrating one example of the method for determining the distance between a first structure element and a second structure element.

An overview of the method is shown in FIG. 3. In some implementations, a process 30 for determining a distance between a first structure element on a substrate and a second structure element can include the following steps.

The process 30 includes providing a first series of first images $A_h(r,c)$ of structure element (step 32).

The process 30 includes providing a second series of second images $B_h(r,c)$ of a second structure element (step 34).

The process 30 includes determining a respective correlation function from a respective first image of the first series and a respective second image of the second series: $R_h^{AB}(i, j)=\text{corr}[A_h(r,c), B_h(r,c)]$ (step 36).

The process 30 includes determining an ensemble correlation function from the correlation functions:

$$R_{Ensemble}(i, j) = \frac{1}{z}\sum_{h=0}^{z} R_h^{AB}(i, j). \qquad \text{(step 38)}$$

The process 30 includes determining the distance between the first structure element and the second structure element as a maximum of the ensemble correlation function (step 40).

In one variant of the method, the ensemble correlation is applied to focus stacks that were determined by Through-focus Scanning Optical Microscopy (TSOM) and/or Scatterfield Optical Microscopy (SOM). See Attota et al., "Through-focus scanning and scatterfield optical methods for advanced overlay target analysis," Proc. SPIE 7272, Metrology, Inspection, and Process Control for Microlithography XXIII, 7272.14 (2.3 March 2009). Since, both in TSOM and in SOM, firstly volume data are calculated from the different images of the focus gradations, the analysis then being carried out on said volume data, here through the use of the ensemble correlation it is additionally possible advantageously to reduce the analysis dimension from 3D to 2D—and thus the complexity or required computing power.

For example, the features described above related to processing of data (e.g., calculation of Equations 1 to 3) can be implemented by the image processing device 16, which can include one or more of digital electronic circuitry, computer hardware, firmware, and software. For example, some of the features can be implemented in a computer program product tangibly embodied in an information earlier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, C #, Objective-C, Java, Python), including script, compiled, or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, flash memory devices, and 3D XPoint™ memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a liquid crystal display (LCD) or an organic light emitting diode (OLED) monitor for displaying information to the user and a keyboard and a pointing device such as a mouse or a trackball, or a touch or voice interface by which the user can provide input to the computer.

A number of implementations have been described. Nevertheless, it will be understood that various modifications may be made. Accordingly, other implementations are within the scope of the following claims.

What is claimed is:

1. A method for determining a distance between a first structure element on a substrate and a second structure element, comprising the following steps:
providing a first series of first images, wherein each of the first images comprises at least the first structure element;
providing a second series of second images, wherein each of the second images comprises at least the second structure element;
for each image of the first and second series: determining a respective correlation function from a respective first image of the first series and a respective second image of the second series;
determining an ensemble correlation function from an average of the correlation functions; and
determining the distance from the ensemble correlation function.

2. The method according to claim 1, wherein an aerial image or a phase image is provided as at least one of the images.

3. The method according to claim 1, wherein at least one of the images is determined by a microscope.

4. The method according to claim 1, wherein at least one of the images is determined by simulation.

5. The method according to claim 1, wherein a phase image is provided as at least one of the images, at least two aerial images are recorded for the purpose of determining the phase image, wherein the at least two aerial images are recorded under diversified conditions.

6. The method according to claim 1, wherein the images of the second series are determined by mirroring from the images of the first series.

7. The method according to claim 1, wherein recording conditions for recording the images are varied within a series of aerial images, wherein the recording conditions of the first and second aerial images of the first and second series are identical in pairs.

8. The method according to claim 7, wherein the varied recording conditions include at least one of illumination settings or focus settings.

9. The method according to claim 1, wherein at least one region of the second structure element which is taken into account in the determination of the distance is predefined in the images.

10. The method according to claim 1, wherein the second structure element or the at least one region of the second structure element is embodied as an edge of the structure element.

11. A microscope comprising:
a light source;
an illumination optical unit;
a detector for recording an image;
an imaging optical unit comprising a lens and configured to, in combination with one or more other optical units, generate an image of at least one structure element of a substrate on the detector; and
a computer for carrying out a process comprising:
determining a first series of first images, wherein each of the first images comprises the at least one structure element of the substrate, and at least one of the first images is provided by the detector;
determining a second series of second images, wherein each of the second images comprises at least a second structure element;
for each image of the first and second series: determining a respective correlation function from a respective first image of the first series and a respective second image of the second series;
determining an ensemble correlation function from an average of the correlation functions; and
determining the distance from the ensemble correlation function.

12. The microscope of claim 11 in which an aerial image or a phase image is provided as at least one of the images.

13. The microscope of claim 11 in which the computer is configured to simulate at least one of the second images.

14. The microscope of claim 11 in which the microscope is configured such that a phase image is provided as at least one of the images, at least two aerial images are recorded for the purpose of determining the phase image, wherein the at least two aerial images are recorded under diversified conditions.

15. The microscope of claim 11 in which the computer is configured to determine the images of the second series by mirroring from the images of the first series.

16. The microscope of claim 11 in which the microscope is configured such that recording conditions for recording the images are varied within a series of aerial images, wherein the recording conditions of the first and second aerial images of the first and second series are identical in pairs.

17. The microscope of claim 16 in which the microscope is configured such that the varied recording conditions include at least one of illumination settings or focus settings.

18. A method for determining a distance between a structure element shown in a first series of first images and the structure element shown in a second series of second images, comprising:
for each image of the first and second series, determining a respective correlation function from a respective first image of the first series and a respective second image of the second series;
determining an ensemble correlation function from the correlation functions; and
determining the distance from the ensemble correlation function.

19. The method of claim 18 in which an aerial image or a phase image is provided as at least one of the images.

20. The method of claim 18 in which determining a respective correlation function from a respective first image of the first series and a respective second image of the second series comprises determining a respective cross correlation between a respective first image of the first series and a respective second image of the second series.

21. The microscope of claim 11 in which the imaging optical unit comprises a spatial frequency filter.

* * * * *

UNITED STATES PATENT AND TRADEMARK OFFICE
CERTIFICATE OF CORRECTION

Page 1 of 2

PATENT NO. : 10,535,132 B2
APPLICATION NO. : 15/713042
DATED : January 14, 2020
INVENTOR(S) : Joerg Frederik Blumrich It is certified that error appears in the above-identified patent and that said Letters Patent is hereby corrected as shown below:

On the Title Page

Column 1, Item (73) (Assignee)
Line 1, delete "SmbH" and insert -- GmbH --

In the Specification

Column 1
Line 58, delete "DE10201.5218917" and insert -- DE102015218917 --

Column 3
Line 41, delete "DE10201.5218917" and insert -- DE102015218917 --

Column 4
Line 47, delete "DEI02010047051" and insert -- DE102010047051 --

Column 5
Line 38 (approx.), delete "control:" and insert -- control. --

Column 7
Line 43, delete "Zemike" and insert -- Zernike --

Column 9
Line 25, delete "hick" and insert -- which --
Line 37, delete "IN/licroSim" and insert -- MicroSim --

Column 11
Line 36, after "of" insert -- a first --
Line 63, delete "7272.14 (2.3" and insert -- 727214 (23 --

Signed and Sealed this
Twenty-fourth Day of March, 2020

Andrei Iancu
*Director of the United States Patent and Trademark Office*

Column 12
Lines 9-10, delete "earlier" and insert -- carrier --